(12) United States Patent
Chang et al.

(10) Patent No.: US 12,438,031 B2
(45) Date of Patent: Oct. 7, 2025

(54) BONDING SYSTEM AND METHOD FOR USING THE SAME

(71) Applicant: Taiwan Semiconductor Manufacturing Co., Ltd., Hsinchu (TW)

(72) Inventors: Chieh Chang, Hsinchu (TW); Jyh-Cherng Sheu, Hsinchu (TW); Chen-Fong Tsai, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 494 days.

(21) Appl. No.: 17/532,511

(22) Filed: Nov. 22, 2021

(65) Prior Publication Data

US 2022/0344197 A1   Oct. 27, 2022

Related U.S. Application Data

(60) Provisional application No. 63/178,149, filed on Apr. 22, 2021.

(51) Int. Cl.
*H01L 21/687* (2006.01)
*H01L 21/67* (2006.01)
*H01L 21/683* (2006.01)

(52) U.S. Cl.
CPC .. *H01L 21/68714* (2013.01); *H01L 21/67259* (2013.01); *H01L 21/6838* (2013.01)

(58) Field of Classification Search
CPC ......... H01L 21/68714; H01L 21/67259; H01L 21/6838; H01L 21/67092
See application file for complete search history.

(56) References Cited

U.S. PATENT DOCUMENTS

| | | | |
|---|---|---|---|
| 10,553,565 B2 * | 2/2020 | Guo | H01L 21/67288 |
| 2013/0312907 A1 | 11/2013 | Oh et al. | |
| 2014/0261960 A1 * | 9/2014 | Lin | H01L 21/02 156/286 |
| 2014/0338813 A1 | 11/2014 | Ookawa | |
| 2015/0210057 A1 | 7/2015 | Wagenleithner | |
| 2016/0155721 A1 | 6/2016 | Sugakawa | |
| 2018/0047699 A1 | 2/2018 | Omori | |

(Continued)

OTHER PUBLICATIONS

Eneas N. Morel and Jorge R. Torga. "Spectral Low Coherence Interferometry: A Complete Analysis of the Detection System and the Signal Processing" ISBN: 978-953-51-0403-2, dated 2012 (Year: 2012).*

(Continued)

*Primary Examiner* — Alex B Efta
*Assistant Examiner* — Alexander S Wright
(74) *Attorney, Agent, or Firm* — Slater Matsil, LLP

(57) ABSTRACT

A method includes mounting a first wafer on a first wafer chuck and mounting a second wafer on a second wafer chuck. The second wafer is brought into physical contact with the first wafer. A relative distance between the first wafer and the second wafer is monitored using a distance sensor. A pressure of a vacuum zone on the second wafer chuck is controlled using feedback from the distance sensor. The bonded first wafer and second wafer are removed from the first wafer chuck.

20 Claims, 18 Drawing Sheets

(56) References Cited

U.S. PATENT DOCUMENTS

| | | |
|---|---|---|
| 2018/0370210 A1 | 12/2018 | Kim |
| 2019/0096848 A1* | 3/2019 | Huang .................. H01L 24/94 |
| 2019/0228995 A1 | 7/2019 | Wimplinger et al. |
| 2020/0003195 A1 | 1/2020 | Furuta et al. |
| 2020/0055296 A1 | 2/2020 | Kim |
| 2020/0075533 A1* | 3/2020 | Gao ..................... H01L 24/08 |
| 2020/0294828 A1 | 9/2020 | Tsai |
| 2021/0010157 A1 | 1/2021 | Takahashi et al. |
| 2021/0057263 A1 | 2/2021 | Kim |
| 2021/0057373 A1 | 2/2021 | Kim et al. |
| 2021/0287926 A1 | 9/2021 | Eto |
| 2022/0026196 A1 | 1/2022 | Zinner |
| 2024/0387445 A1 | 11/2024 | Chen et al. |

OTHER PUBLICATIONS

Jim Lucas. "What is Infrared?", Live Science, Dated Feb. 27, 2019 (Year: 2019).*

A. Castex et al. "Mechanism of Edge Bonding Void Formation in Hydrophilic Direct Wafer Bonding," ECS Solid State Letters, 2, Mar. 23, 2013, pp. 47-50.

Gosele et al., "What determines the lateral bonding speed in silicon wafer bonding," Appl. Phys. Lett. Aug. 7, 1995, 67 (6), 863-865.

Navarro, "Direct Wafter Bonding Dynamics," HAL Open Science, Mechanics [physics.med-ph]. Université de Grenoble, Jul. 2014, 116 pages.

Wortman et al., Young's Modulus, Shear Modulus, and Poisson's Ratio in Silicon and Germanium, J. Appl. Phys., Jan. 1, 1965, 36 (1), 153-156.

* cited by examiner

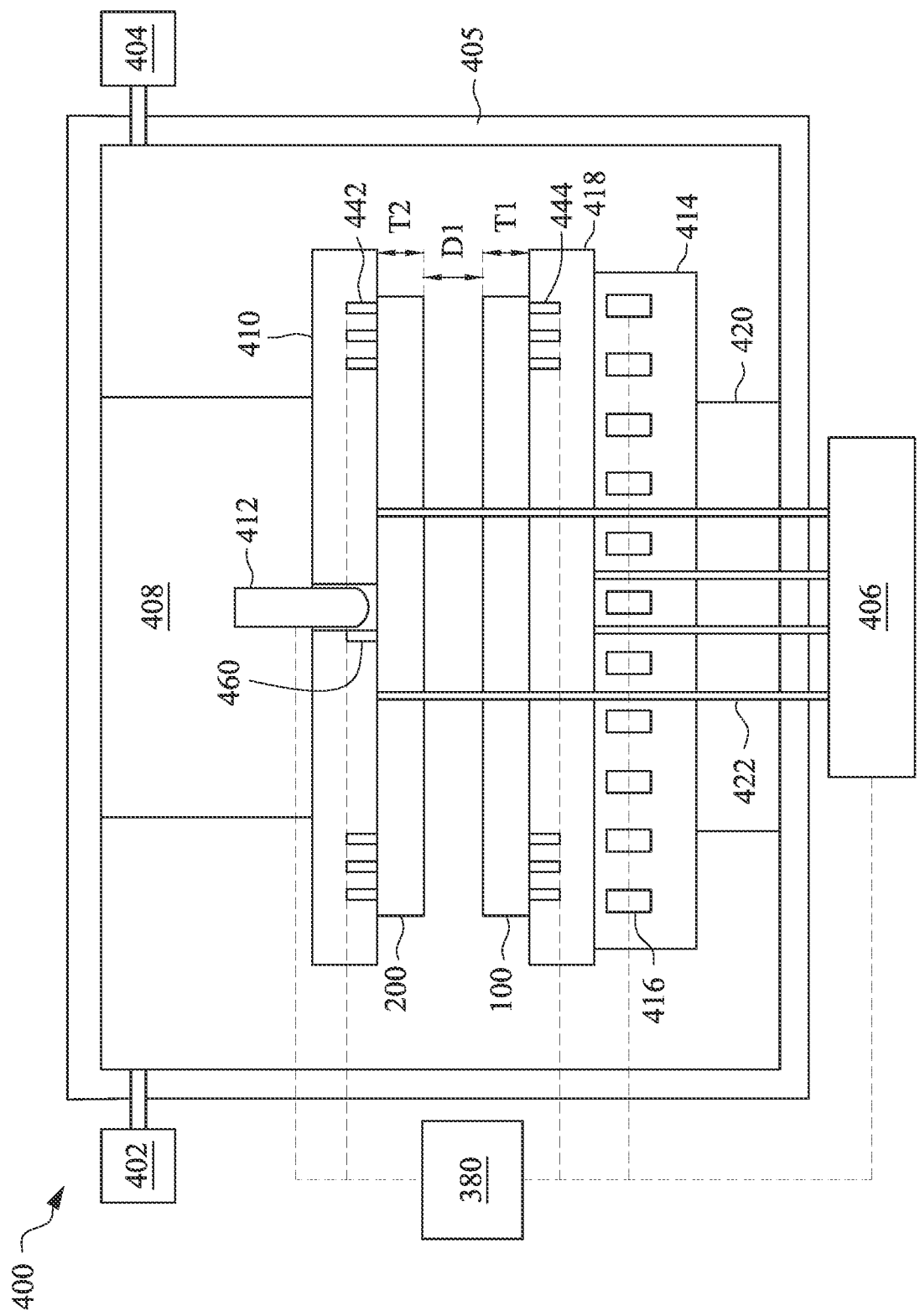

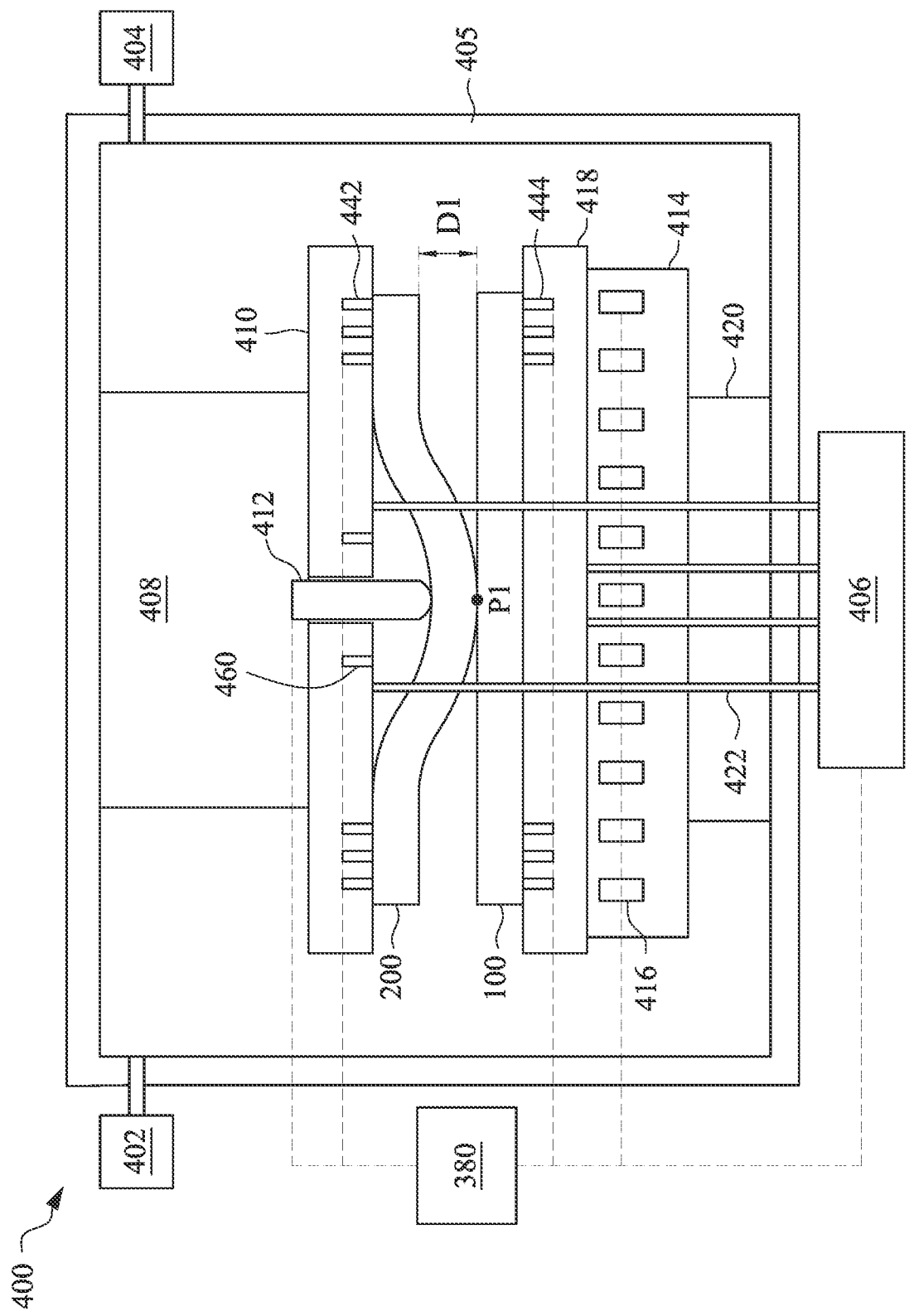

BONDING SYSTEM AND METHOD FOR USING THE SAME

PRIORITY CLAIM AND CROSS-REFERENCE

This application claims the benefit of U.S. Provisional Application No. 63/178,149, filed on Apr. 22, 2021, which application is hereby incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In fusion bonding, an oxide surface of a wafer is bonded to an oxide surface or a silicon surface of another wafer. In eutectic bonding, two eutectic materials are placed together, and a high pressure and a high temperature are applied. The eutectic materials are hence melted. When the melted eutectic materials solidify, the wafers bond together. In direct metal-to-metal bonding, two metal pads are pressed against each other at an elevated temperature, and the inter-diffusion of the metal pads causes the bonding of the metal pads. In hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A illustrates a cross-sectional view of an intermediate step in a bonding process, in accordance with some embodiments.

FIG. 5A illustrates a cross-sectional view of an intermediate step in a bonding process, in accordance with some embodiments.

DETAILED DESCRIPTION

Figure 1:
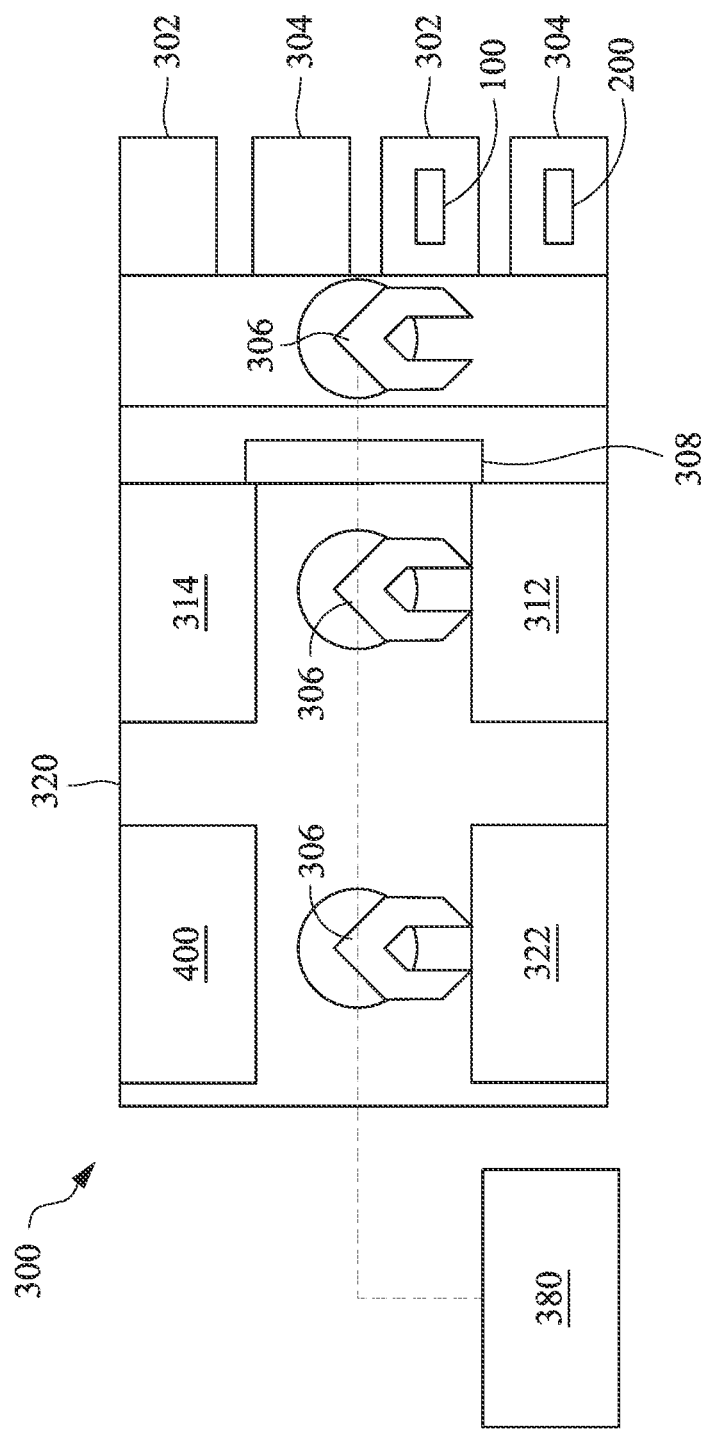
FIG. 1 illustrates a top-view of a bonding system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a wafer bonding system is utilized. The wafer bonding system allows for the bonding of a first wafer to a second wafer with a more uniform bonding wave velocity. The distance between the first wafer and the second wafer at different radial and angular positions is monitored in real time by distance sensors. Measurements from the distance sensors are used to control the vacuum pressure of vacuum zones on a wafer chuck holding the second wafer, which modulates the bonding wave velocity. By controlling the bonding wave propagation to be more uniform in radial and angular directions, distortion of the bonded wafer pairs from stress and strain variation may be reduced, which may reduce unfavorable patterning shape changes.

FIG. 1 shows a top view of a wafer bonding system 300 that may be used to bond a wafer 100 with a wafer 200. The process flow in accordance with the embodiments is briefly described below, and the details of the process flow and the wafer bonding system 300 are discussed, referencing FIGS. 2A through 6B. In some embodiments, the wafer bonding system 300 can be used to bond the wafers 100 and 200 through semiconductor-on-insulator (SOI) bonding, fusion bonding (e.g., hydrophilic bonding or hydrophobic bonding), eutectic bonding, hybrid bonding, or the like. However, any suitable method of bonding may be utilized.

The wafers 100 and 200 may be semiconductor wafers, such as silicon wafers, or semiconductor substrates, such as bulk semiconductors, a semiconductor-on-insulator (SOI) substrate, or the like, which may be doped (e.g., with a p-type or an n-type dopant) or undoped. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the wafers 100 and 200 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. In some embodiments, the wafers 100 and 200 comprise silicon, silicon germanium, combinations of these, or the like, and outer surfaces of the wafers 100 and 200 to be bonded may have a Si—O—Si crystalline structure.

In some embodiments, the wafers 100 and 200 are package components comprising a device wafer, a package substrate, an interposer wafer, or the like. In the embodiments in which the wafer 100 comprises a device wafer, the wafer 100 may include a semiconductor substrate, which may be, for example, a silicon substrate, although other semiconductor substrates are also usable. Active devices may be formed on a surface of the substrate, and may include, for example, transistors. Metal lines and vias may be formed in dielectric layers over the substrate, which may be low-k dielectric layers in some embodiments. The low-k dielectric layers may have dielectric constants (k values) lower than, for example, about 3.5, lower than about 3.0, or lower than about 2.5. The dielectric layers may also comprise non-low-k dielectric materials with dielectric constants (k values) greater than 3.9. The metal lines and vias may comprise copper, aluminum, nickel, tungsten, or alloys thereof. The metal lines and vias interconnect the active devices, and may connect the active devices to overlying metal pads formed on the dielectric layers. In some embodiments, the wafer 100 is an interposer wafer, which is free from active devices therein. The wafer 100 may or may not include passive devices (not shown) such as resistors, capacitors, inductors, transformers, and the like in accordance with some embodiments. In some embodiments, the wafer 100 is a package substrate. In some embodiments, the wafer 100 includes laminate package substrates, wherein conductive traces are embedded in laminate dielectric layers. In some embodiments, the wafers 100 and 200 are build-up package substrates, which comprise cores and conductive traces built on the opposite sides of the cores.

In some embodiments, the wafer bonding system 300 comprises loading stations 302 and 304, transfer robots 306 to move wafers between areas of the wafer bonding system 300, a controller 380, and a bonding area 320 containing a pre-alignment module 312, a surface treatment station 314, a cleaning station 322, and a bonding station 400. However, more or fewer stations may be utilized within the wafer bonding system 300. In some embodiments, the controller 380 comprises a programmable computer. The controller 380 is illustrated as a single element for illustrative purposes. In some embodiments, the controller 380 comprises multiple elements. The controller 380 may be connected to the transfer robots 306 and may be configured to move the wafers 100 and 200 through the bonding process.

To start the bonding process, the wafers that are to be bonded (for example, wafers 100 and 200) are loaded into the wafer bonding system 300 through one or more of the loading stations 302 and 304. For example, in some embodiments loading stations 302 are front opening unified pods (FOUPs) used to load wafers 100 (e.g., bottom wafers) and loading stations 304 are FOUPs used to load wafers 200 (e.g., top wafers). However, any suitable methods and loading stations may be utilized.

A transfer robot 306 adjacent to both the loading stations 302 and the bonding area 320 receives the wafers 100 and 200 from the loading stations 302 and 304 and places them into a load-lock 308 for the bonding area 320. The bonding area 320 may be a vacuum environment (a vacuum chamber). Furthermore, the bonding area 320 may be surrounded by a chamber housing 315 (see below, FIG. 2A) made of material that is inert to the various process materials. As such, while the bonding area 320 may be any suitable material that can withstand the chemistries and pressures involved in the treatment process, in an embodiment the bonding area 320 may be steel, stainless steel, nickel, aluminum, alloys of these, combinations of these, and the like.

The bonding area 320 may also be connected to one or more vacuum pumps 406 (see below, FIG. 2A) for exhaust from the treatment area. In an embodiment the vacuum pump 406 is under the control of the controller 380, and may be utilized to control the pressure within the bonding area 320 to a desired pressure. Additionally, once the bonding process is completed, the vacuum pump 406 may be utilized to evacuate the bonding area 320 in preparation for removal of the wafers 100 and 200.

In the bonding area 320, the wafers 100 and 200 are transferred by a transfer robot 306 to a pre-alignment module 312. In an embodiment the pre-alignment module 312 may comprise one or more rotating arms which can rotate the wafers 100 and 200 to any desired rotational position using, e.g., a notch located within the wafers 100 and 200 (not separately illustrated for clarity). However, any suitable angular position may be utilized.

Figure 2A:
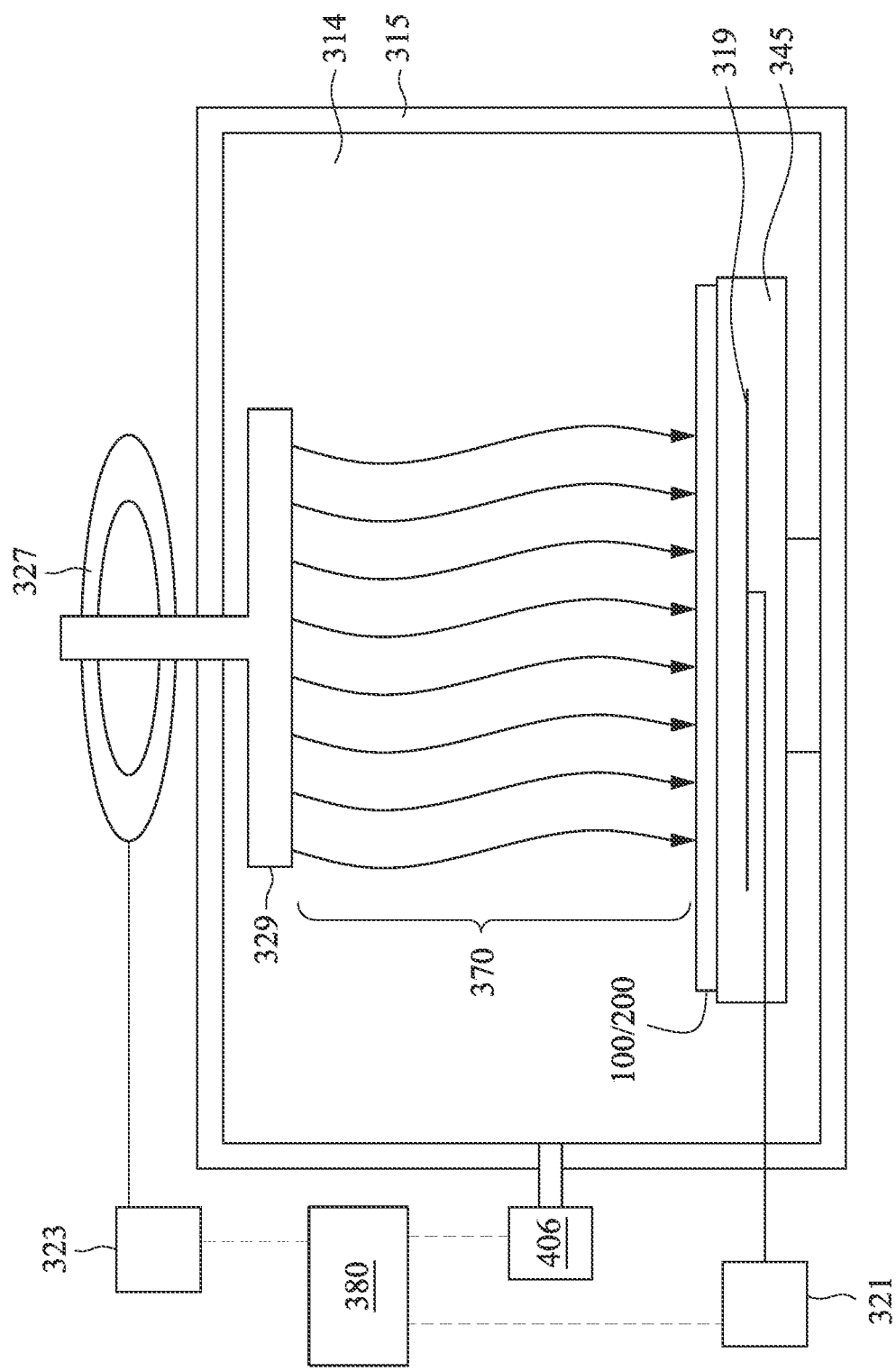
FIG. 2A illustrates a cross-sectional view of an intermediate step in a bonding process, in accordance with some embodiments.

Next, referring to FIG. 2A, a transfer robot 306 within the bonding area 320 transfers the wafers 100 and 200 from the pre-alignment module 312 to the surface treatment station 314. In some embodiments, the surface treatment station 314 is utilized to perform a surface treatment 370, or surface activation, on the surfaces of the wafers 100 and 200. In some embodiments, the surface treatment 370 includes a plasma activation step, a liquid activation step, combinations of these, or the like. However, any suitable surface treatment may be utilized.

Within the surface treatment station 314 is located a mounting platform 345 in order to position and control the wafers 100 and 200 during the surface treatment 370. The mounting platform 345 may hold one or more of the wafers 100 and 200 using a combination of clamps, vacuum pressure, and/or electrostatic forces, and may also include heating and cooling mechanisms in order to control the temperature of the wafers 100 and 200 during the processes.

Additionally, in embodiments in which the surface treatment 370 is a plasma activation treatment, the mounting platform 345 may further comprise a lower electrode 319 coupled to a first RF generator 321. The lower electrode 319 may be electrically biased by the first RF generator 321 (which may be connected to and under control of the controller 380) at a RF voltage during the surface treatment 370. By being electrically biased, the lower electrode 319 is used to provide a bias to the incoming treatment gases and assist to ignite them into a treatment plasma. Additionally, the lower electrode 319 is also utilized to maintain the plasma during the surface treatment 370.

Furthermore, while a single mounting platform 345 is illustrated in FIG. 2A, this is merely intended for clarity and is not intended to be limiting. Rather, any number of mounting platforms 345 may additionally be included within the surface treatment station 314. As such, multiple semiconductor substrates may be treated simultaneously.

Additionally, the surface treatment station 314 comprises a showerhead 329. The showerhead 329 receives the treatment plasma and helps to disperse the treatment plasma into the surface treatment station 314. In some embodiments, the showerhead 329 is designed to evenly disperse the treatment gases in order to minimize undesired process conditions that may arise from uneven dispersal and has a circular design with openings dispersed evenly around the showerhead 329 to allow for the even dispersal of the treatment plasma into the surface treatment station 314. However, any suitable number and distribution of openings can be used.

The surface treatment station 314 also comprises an upper electrode 327, for use as a plasma generator. In an embodiment the plasma generator may be a transformer coupled plasma generator and may be, e.g., a coil. The coil may be attached to a second RF generator 323 that is utilized to provide power to the upper electrode 327 (which may be connected to and under control of the controller 380) in order to ignite the plasma during introduction of the treatment gases.

However, while the upper electrode 327 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

In the surface treatment 370, the exposed surfaces of the wafers 100 and 200 are activated. For example, in an embodiment, the bonding area may initially be purged with an inert gas ambient such as e.g. Ar, $N_2$, the like, or a combination thereof. Once purged a process gas used for generating the plasma may be nitrogen ($N_2$), oxygen ($O_2$), or an $N_2/O_2$ mixture and may be introduced into the surface treatment station 314 through the showerhead 329. However, any suitable process gas may be used to generate the plasma.

Figure 2B:
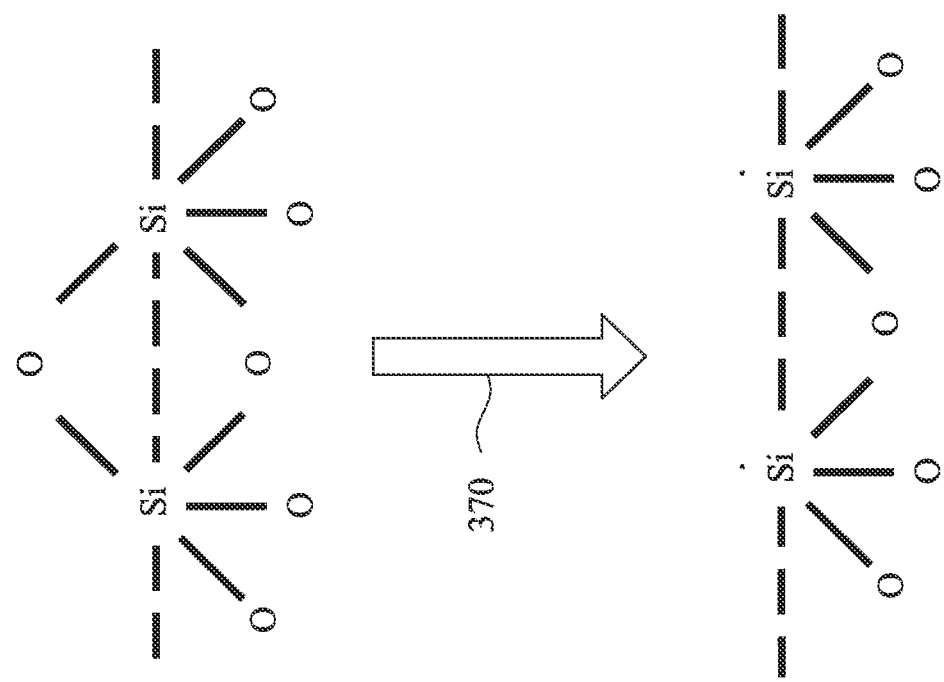
FIG. 2B illustrates a chemical reaction of an intermediate step in a bonding process, in accordance with some embodiments.

FIG. 2B illustrates the effect of the surface treatment 370 on the surfaces of the wafers 100 and 200, in accordance with some embodiments in which the wafers 100 and 200 are silicon wafers to be subsequently bonded by oxide-oxide bonding. The surface treatment 370 acts to remove oxygen atoms from silicon atoms on top surfaces of a silicon oxide layer on the wafers 100 and 200. This activates the surfaces of the wafers 100 and 200 in preparation for subsequent oxide-oxide bonding.

Figure 3A:
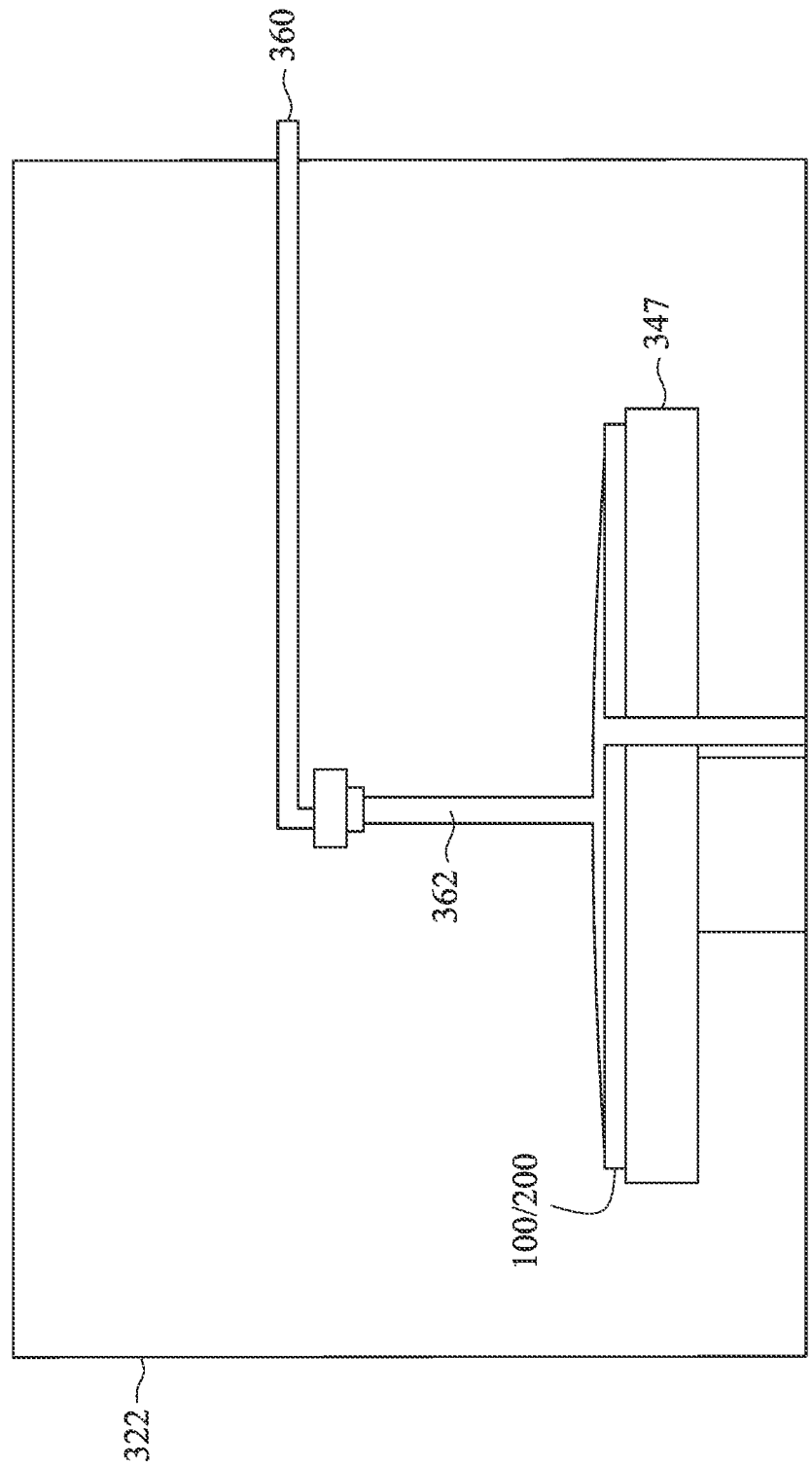
FIG. 3A illustrates a cross-sectional view of an intermediate step in a bonding process, in accordance with some embodiments.

Referring to FIG. 1 and FIG. 3A (with FIG. 3A illustrating a view of the cleaning station 322 in FIG. 1), once the surface treatment 370 has been performed, a transfer robot 306 transfers the wafers 100 and 200 to the cleaning station 322. The cleaning station 322 may be used to perform a cleaning step on the wafers 100 and 200 to remove metal oxides, chemicals, particles, and other undesirable substances from the surfaces of the wafers 100 and 200 prior to bonding.

In an embodiment the cleaning station 322 comprises a mounting station 347 and a faucet 360. The mounting station 347 may be similar to the mounting platform 345 described above with respect to FIG. 2A. For example, the mounting station 347 may hold one or more of the wafers 100 and 200 using a combination of clamps, vacuum pressure, and/or electrostatic forces, and may also include heating and cooling mechanisms. However, any suitable devices for holding the wafers 100 and 200 may be utilized.

The faucet 360 is positioned over the mounting station 347 in order to dispense one or more cleaning agents over wafers 100 and 200 when the wafers 100 and 200 are mounted in the mounting station 347. During the cleaning step, the wafers 100 and 200 are mounted in the mounting station 347 and a cleaning agent 362 is then dispensed from the faucet 360 over the wafers 100 and 200. In some embodiments, the cleaning agent 362 is deionized (DI) water. In other embodiments the cleaning agent 362 comprises, in addition to DI water, a chemical such as $NH_3$, $H_2O_2$, citric acid, or the like. However, any suitable cleaning agent 362 may be utilized.

Figure 3B:
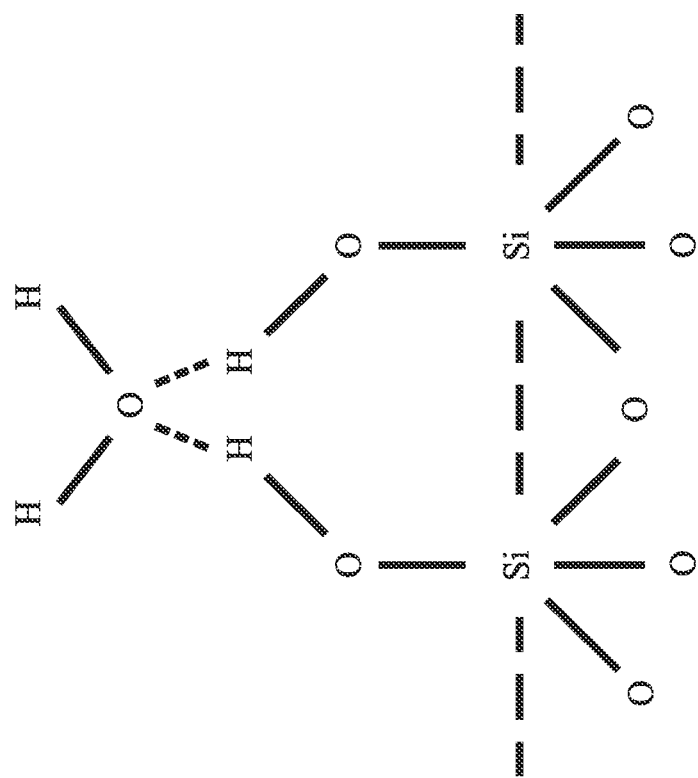
FIG. 3B illustrates a chemical reaction of an intermediate step in a bonding process, in accordance with some embodiments.

FIG. 3B illustrates the effect of the cleaning agent 362 on the surfaces of the wafers 100 and 200, in accordance with some embodiments in which the wafers 100 and 200 are silicon wafers to be subsequently bonded by oxide-oxide bonding and the cleaning agent 362 comprises water. Silanol groups form on the activated surface of the wafers 100 and 200 and water molecules attach to the silanol groups, which is advantageous for subsequent oxide-oxide bonding between the wafers 100 and 200.

Figure 4B:
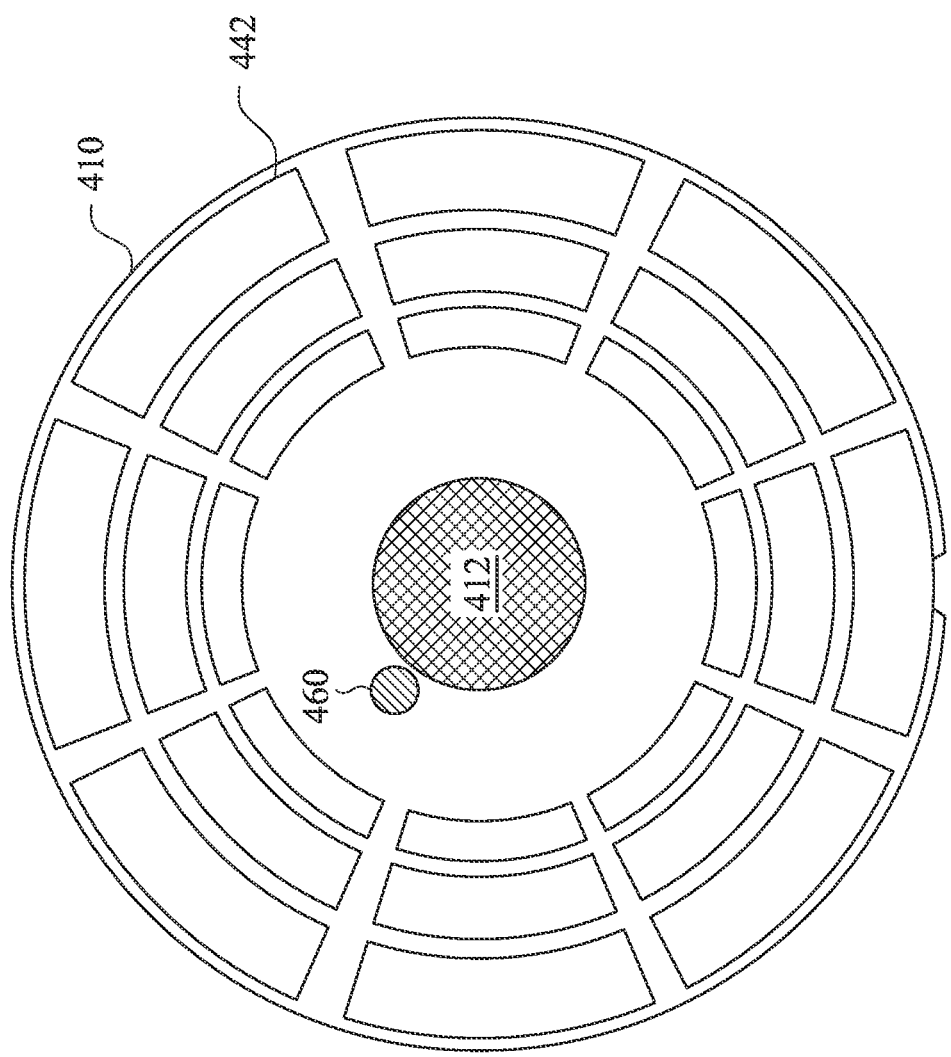
FIG. 4B illustrates a bottom view of a wafer chuck in a bonding system, in accordance with some embodiments.
Figure 4C:
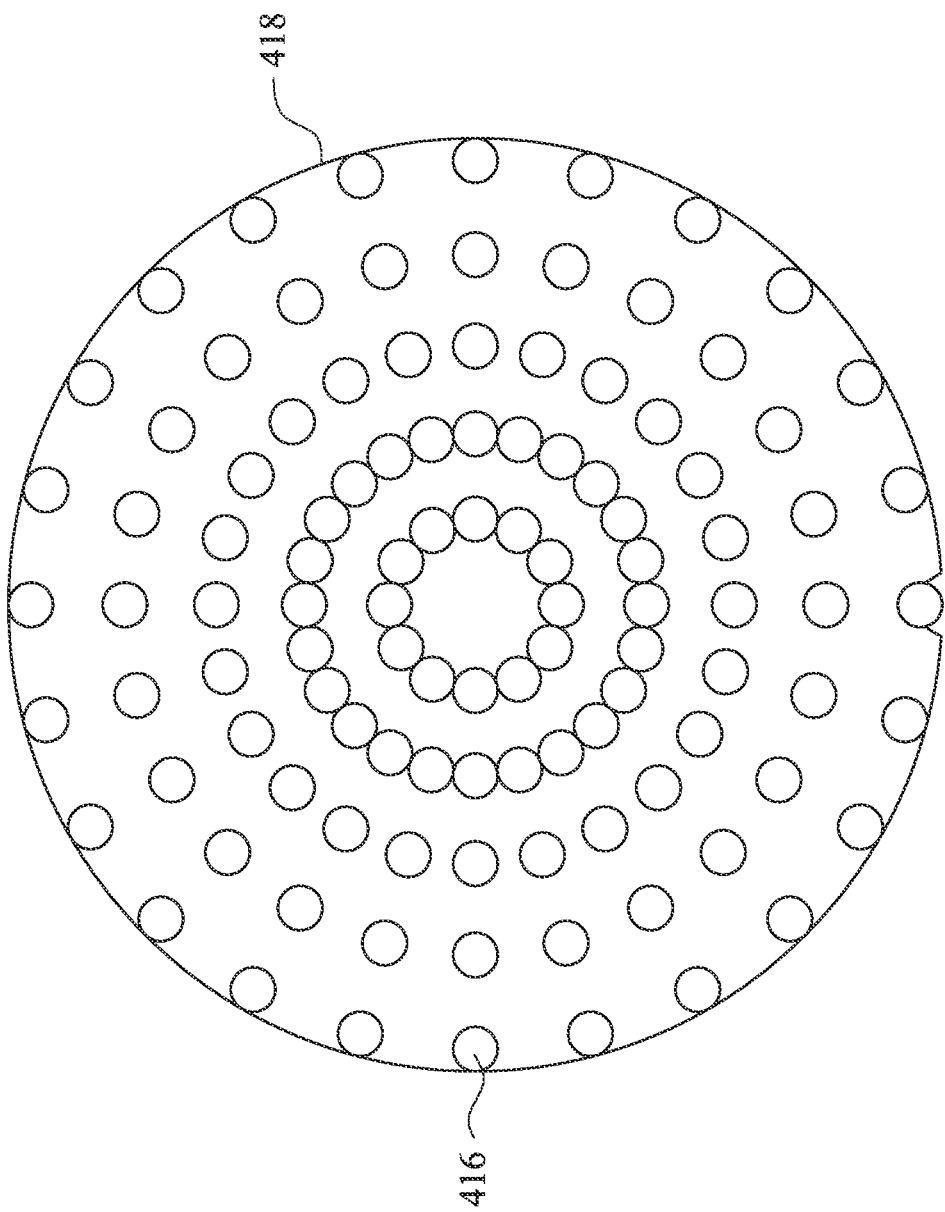
FIG. 4C illustrates a top view of a wafer chuck in a bonding system, in accordance with some embodiments.

Next, referring to FIG. 1 and FIGS. 4A through 4C (with FIG. 4A illustrating a close-up view of the bonding station 400 in FIG. 1, FIG. 4B illustrating a bottom view of top wafer chuck 410, and FIG. 4C illustrating a top view through bottom wafer chuck 418), a transfer robot 306 within the bonding area 320 transfers the wafers 100 and 200 from the cleaning station 322 to the bonding station 400. The bonding station 400 illustrated herein is limited solely for the purpose of clearly illustrating the inventive aspects of the various embodiments. The present invention is not limited to any particular wafer bonding equipment. The bonding station 400 comprises a chamber 405, one or more gas outlets 404, and one or more gas inlets 402. An ambient pressure inside the chamber 405 can be controlled by flowing gas/air into the chamber 405 through the gas inlets 402 and removing gas/air from the chamber 405 via the gas outlets 404 through the use of one or more vacuum pumps connected to the gas outlets 404. The bonding station 400 comprises a top wafer chuck 410 and a bottom wafer chuck 418 that can be positioned to face each other. The top wafer chuck 410 and the bottom wafer chuck 418 are moveable relative to each other in order to move wafers mounted on the top wafer chuck 410 and the bottom wafer chuck 418 together for bonding. In some embodiments, the top wafer chuck 410 and the bottom wafer chuck 418 are used to bond two semiconductor wafers (e.g., the wafer 100 to the wafer 200) or two package components together. The top wafer chuck 410 is attached to a top arm 408, and the bottom wafer chuck 418 is attached to a bottom arm 420. In some embodiments, the bottom wafer chuck 418 is disposed on a mounting structure 414 on the bottom arm 420.

The top wafer chuck 410 and the bottom wafer chuck 418 are used in order to hold and control the orientation and movement of the wafers 100 and 200 during the bonding process. In some embodiments, the top wafer chuck 410 comprises any suitable material that may be used to hold one of the wafers 100 and 200. For example, silicon based materials, such as glass, silicon oxide, silicon nitride, or other materials, such as aluminum oxide, combinations of any of these materials, or the like may be used. In some embodiments, the top wafer chuck 410 comprises one or more light sources 460, such as an infrared light source producing light with a wavelength larger than 1.1 µm. The bottom wafer chuck 418 comprises a material that is at least partially transparent to infrared light, such as infrared light with a wavelength larger than 1.1 µm. For example, in some embodiments the bottom wafer chuck 418 comprises quartz, fused silica, glass, borosilicate glass, the like, or a combination thereof. The top surface of the bottom wafer chuck 418 may have a flatness with surface variations less than 200 nm.

Additionally, the top wafer chuck 410 and the bottom wafer chuck 418 have diameters that are suitable to hold one of the wafers 100 and 200. As such, while the size of the top wafer chuck 410 and the bottom wafer chuck 418 will be in some ways dependent upon the size of the wafers 100 and 200, the top wafer chuck 410 and the bottom wafer chuck 418 can have diameters in a range of 250 mm to 300 mm. However, any suitable dimensions may be utilized.

Furthermore, the bonding station 400 comprises one or more push pins 412. In some embodiments, the one or more push pins 412 are positioned to extend through top wafer chuck 410 and to warp or bend one or more of the wafers 100 and 200. By warping the wafers 100 and 200, physical contact is initially made at a center of the wafers 100 and 200 before allowing the wafers 100 and 200 to bond at the edges.

FIGS. 4A and 4B illustrate the top wafer chuck 410 with a bottom surface that has a plurality of vacuum zones 442 that are connected to one or more vacuum pumps 406 through a series of pipes 422 (see FIG. 4A). Each vacuum zone 442 is connected to a respective pipe 422 (not individually illustrated) such that a vacuum pressure of that vacuum zone 442 can be controlled independently from other vacuum zones 442 of the top wafer chuck 410 by the controller 380. In some embodiments, the bottom wafer chuck 418 has a plurality of vacuum zones 444 that are connected to one or more vacuum pumps 406 through respective pipes 422. The vacuum zones 444 may also be controlled independently from other vacuum zones 444 of the bottom wafer chuck 418 by the controller 380.

During operation, the vacuum pump 406 will evacuate any gases from the vacuum zones 442 and 444 across the bottom surface of the top wafer chuck 410 and across the top surface of the bottom wafer chuck 418, respectively, thereby lowering the pressure (also referred to as the chuck pressure) within these vacuum zones 442 and 444. When the wafer 200 is placed against the bottom surface of the top wafer chuck 410 and the chuck pressure within the vacuum zones 442 at the bottom surface of the top wafer chuck 410 has been reduced by the vacuum pump 406, the pressure difference (e.g., the difference between the pressure in the chamber 405 and the chuck pressure) between the side of the wafer 200 facing the vacuum zones 442 at the bottom surface of the top wafer chuck 410 and the side of the wafer 200 facing away from the vacuum zones 442 at the bottom surface of the top wafer chuck 410 will hold the wafer 200 against the bottom surface of the top wafer chuck 410.

Likewise, when the wafer 100 is placed against the top surface of the bottom wafer chuck 418 and the chuck pressure within the vacuum zones 444 at the top surface of the bottom wafer chuck 418 has been reduced by the vacuum pump 406, the pressure difference (e.g., the difference between the pressure in the chamber 405 and the chuck pressure) between the side of the wafer 100 facing the vacuum zones 444 at the top surface of the bottom wafer chuck 418 and the side of the wafer 100 facing away from the vacuum zones 444 at the top surface of the bottom wafer chuck 418 will hold the wafer 100 against the top surface of the bottom wafer chuck 418. The pressures of the vacuum zones 444 may be controlled individually by the controller 380 to adjust for any warpages of the wafer 100.

At the bonding station 400, the wafers 100 and 200 are mounted on the top wafer chuck 410 and the bottom wafer chuck 418. Once in place the top wafer chuck 410 and the bottom wafer chuck 418 may align the wafers 100 and 200 for bonding. In a particular embodiment the bonding station 400 may align the wafers 100 and 200 to an alignment accuracy in a range of 10 nm to 100 µm. However, any suitable alignment may be performed.

FIG. 4C illustrates a top view through the bottom wafer chuck 418, showing a plurality of distance sensors 416 arranged below the bottom wafer chuck 418. In some embodiments, the distance sensors 416 are mounted in the mounting structure 414 below the bottom wafer chuck 418. The distance sensors 416 are used to monitor the relative distance D1 (see FIGS. 4A and 4D) between the wafers 100 and 200 through the at least partially transparent bottom wafer chuck 418. In some embodiments, the distance sensors 416 are mounted in the mounting structure 414 below the bottom wafer chuck 418. In some embodiments, the distance sensors 416 are low-coherence interferometry (LCI) infrared sensors measuring infrared light from the light source 460 (see above, FIG. 4A), such as infrared light with a wavelength larger than 1.1 µm. In some embodiments, the distance sensors 416 are uniformly distributed in radial and angular directions with respect to the top surface of the bottom wafer chuck 418 in order to perform spatial and temporal mapping of bonding wave propagation during a subsequent bonding process between the wafers 100 and 200 (see below, FIGS. 5A through 7B). However, any suitable distribution and number of distance sensors 416 may be used. In some embodiments, the distance sensors 416 have focal spots with widths in a range of 40 µm to 500 µm.

Figure 4D:
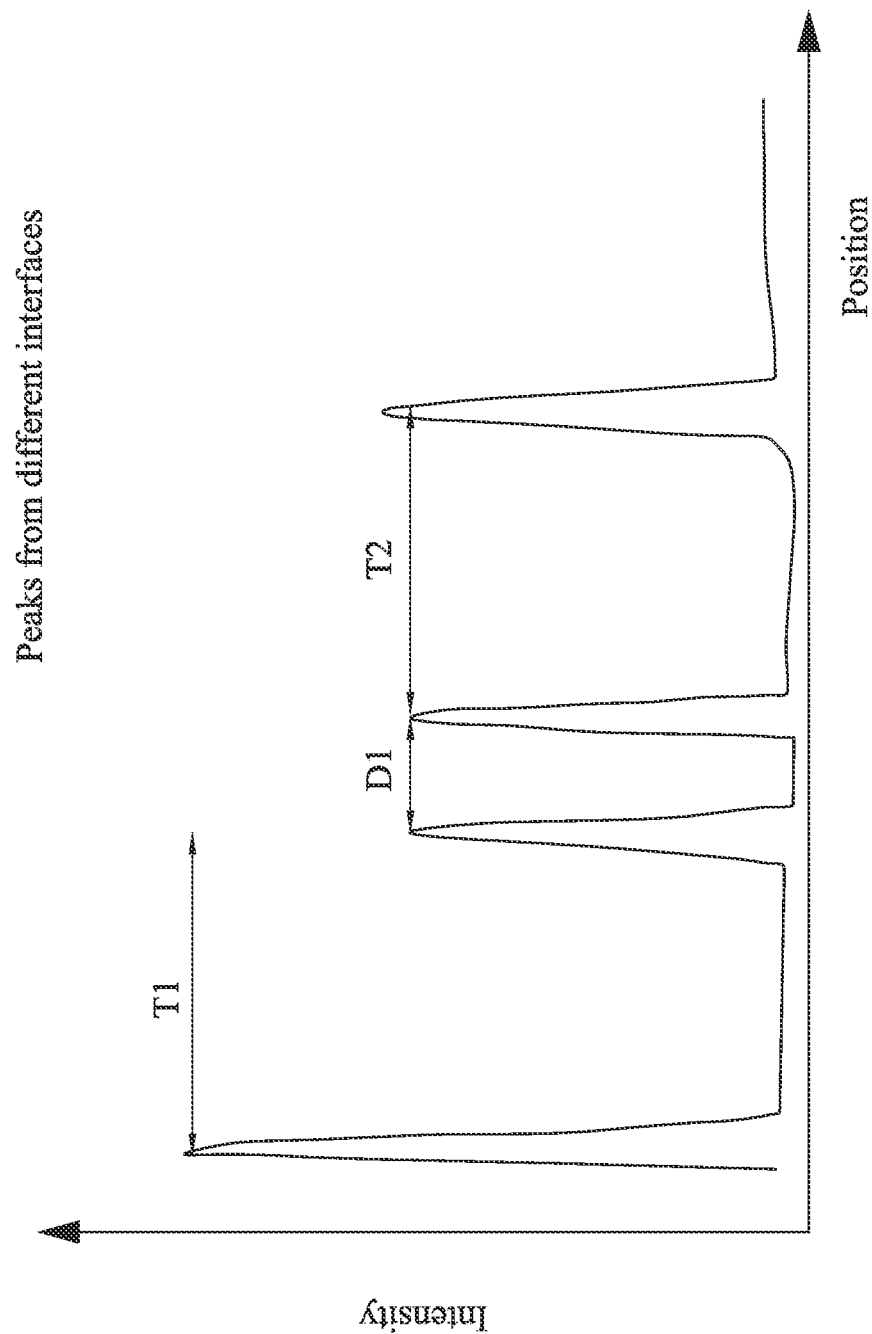
FIG. 4D illustrates an example waveform from a distance sensor in a bonding system, in accordance with some embodiments.

FIG. 4D illustrates an example waveform measured by a distance sensor 416 in accordance with some embodiments in which the distance sensor is an LCI infrared sensor. The distance sensor 416 measures intensity peaks at different interfaces between mediums, such as between the material of the wafer chucks and the material of the wafers or between the material of the wafers and the vacuum or gas adjacent to the wafers. For example, the leftmost intensity peak is at the boundary of the bottom wafer chuck 418 with the wafer 100, the left middle intensity peak is at the top surface of the wafer 100, the right middle intensity peak is at the bottom surface of the wafer 200, and the rightmost intensity peak is at the boundary of the wafer 200 with the top wafer chuck 410. The distance between the leftmost intensity peak and the left middle intensity peak is the thickness T1 of the wafer 100, the distance between the right middle intensity peak and the rightmost intensity peak is the thickness T2 of the wafer 200, and the distance between the left middle intensity peak and the right middle intensity peak is the distance D1 between the wafer 100 and the wafer 200 measured above the distance sensor 416. As such, each distance sensor 416 can measure the respective local distance between the wafer 100 and the wafer 200 at the position above each distance sensor 416. This can be used to perform spatial and temporal mapping of bonding wave propagation during the subsequent bonding of the wafers 100 and 200 (see below, FIGS. 5A through 7B). The use of multiple intensity peaks to identify the respective distance between the wafer 100 and the wafer 200 may provide more reliable measurements of the distance D1.

In some embodiments, the wafer 100 has a thickness T1 in a range of 600 μm to 900 μm and the wafer 200 has a thickness T2 in a range of 600 μm to 900 μm. In some embodiments, the wafers 100 and 200 have a gap between them with a distance D1 in a range of 10 μm to 100 μm prior to the bonding process.

FIG. 5A illustrates the initiation of a bonding process of the wafers 100 and 200. The top wafer chuck 410 and the bottom wafer chuck 418 are initiated to begin moving the wafers 100 and 200 together to a distance D1 (see above, FIGS. 4A and 4D) for bonding. Once in position, one or more of the push pins 412 are utilized to warp or deform one or more of the wafers 100 and/or 200 to initiate the bonding process. In some embodiments, the bonding process is performed by bringing the wafers 100 and 200 into contact by utilizing a combination of the top wafer chuck 410, the bottom wafer chuck 418, and the push pin 412 to apply pressure against the wafers 100 and 200 at a first point P1. For example, the push pin 412 may be extended through the top wafer chuck 410 to deform the wafer 200 and bring the wafer 200 into contact with the wafer 100 at the first point P1. The bonding then proceeds in a wave (also referred to as a bonding wave) from the first point P1 and moving outwards towards the edges of the wafers 100 and 200.

Figure 5B:
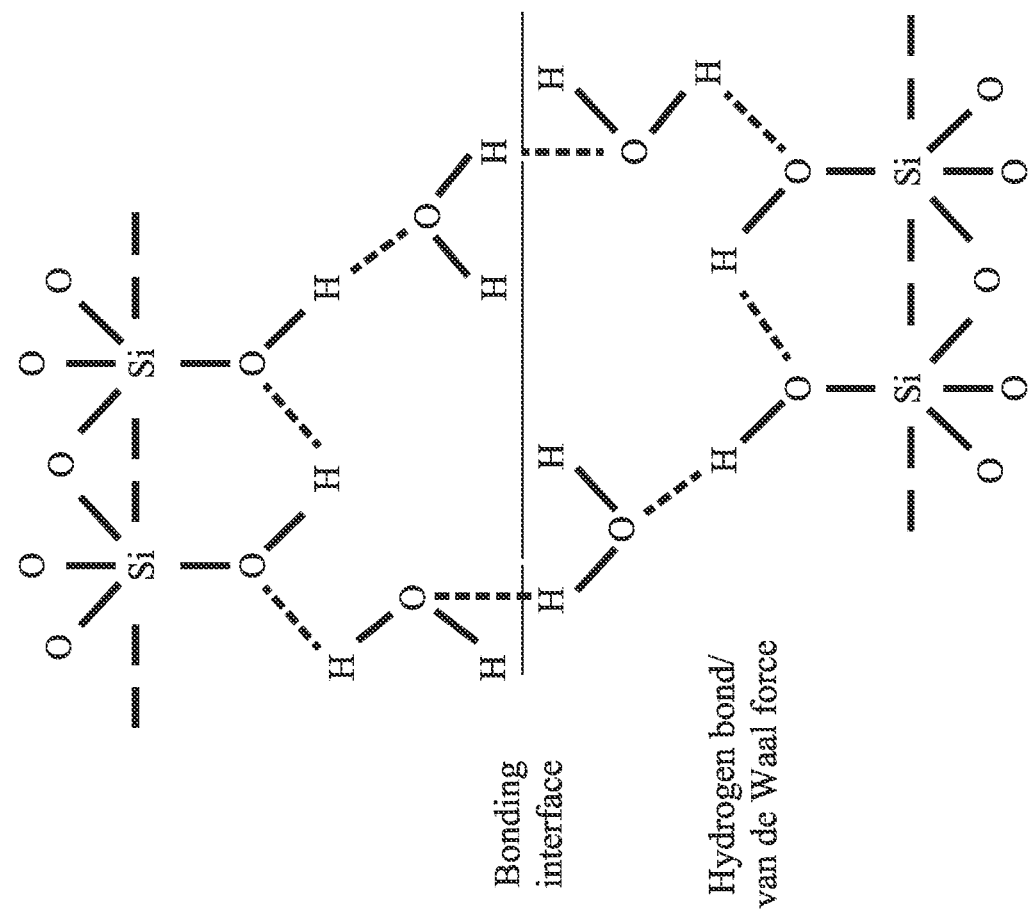
FIG. 5B illustrates a chemical reaction of an intermediate step in a bonding process, in accordance with some embodiments.

FIG. 5B illustrates a formation of bonds between the wafers 100 and 200 across the bonding interface between the wafers 100 and 200, in accordance with some embodiments in which the bonding process includes oxide-oxide bonding. As the bonding wave proceeds outwards from the first point P1, hydrogen bonds between hydrogen and oxygen atoms of water molecules attached to silanol groups on the surfaces of the wafers 100 and 200 may be formed, such as through Van der Waals forces.

Figure 6A:
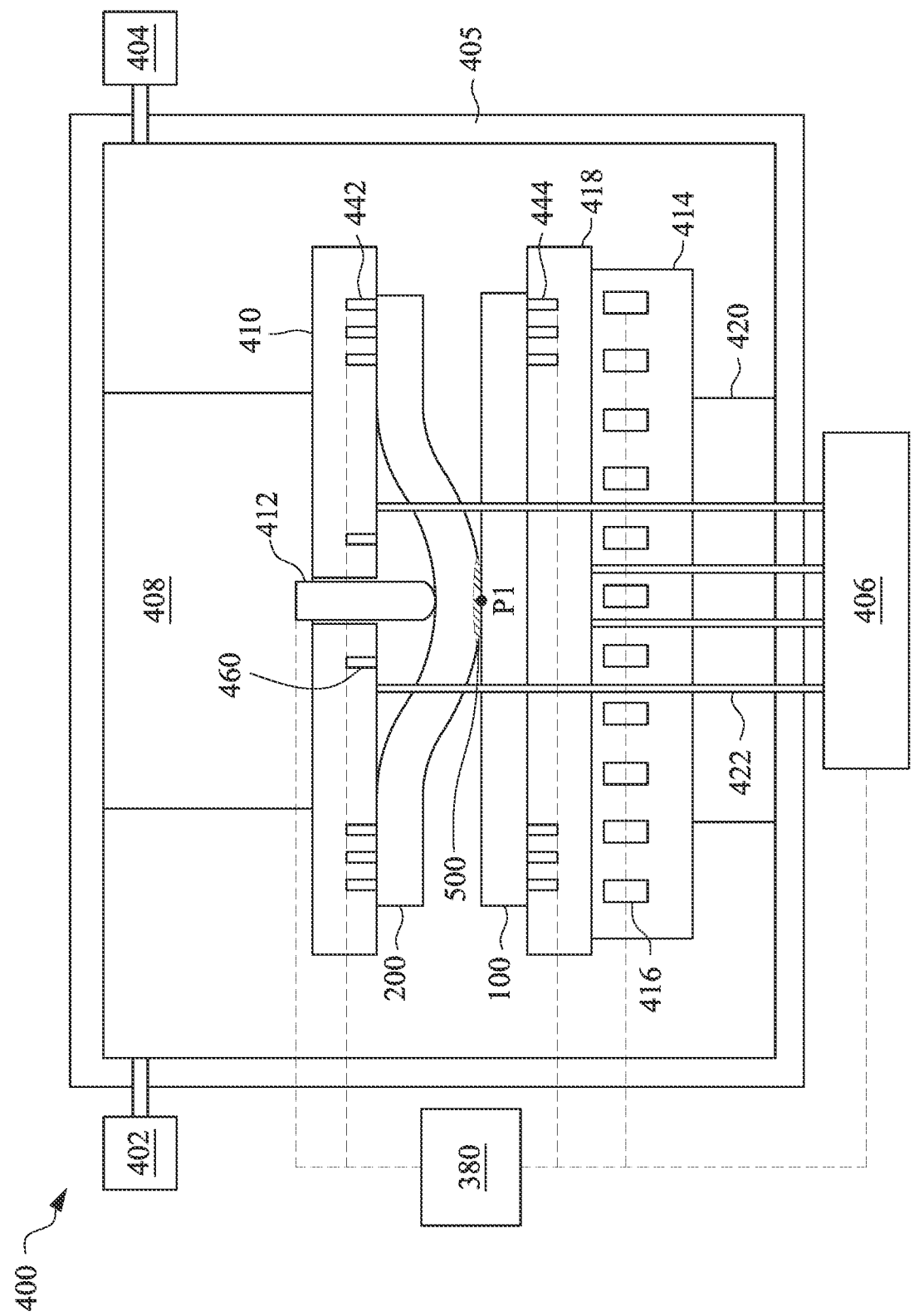
FIG. 6A illustrates a cross-sectional view of an intermediate step in a bonding process, in accordance with some embodiments.
Figure 6B:
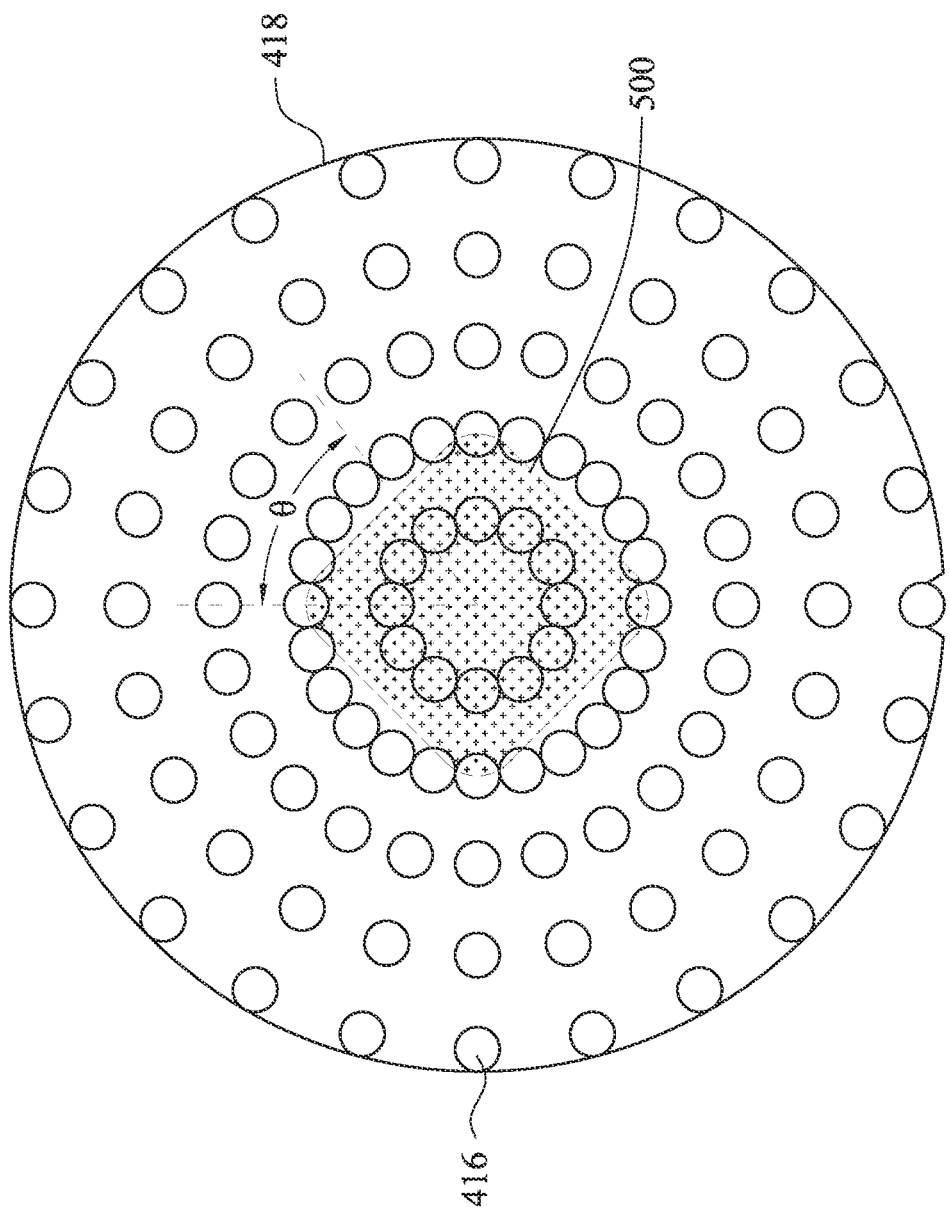
FIG. 6B illustrates a top view of a wafer chuck during an intermediate step in a bonding process, in accordance with some embodiments.

FIGS. 6A and 6B illustrate a first bonding wave 500 propagating outwards from the first point P1 between the wafers 100 and 200. FIG. 6A follows from FIG. 5A, and FIG. 6B illustrates a top view of the bottom wafer chuck 418 showing the outline of the first bonding wave 500 over the distance sensors 416 mounted beneath the bottom wafer chuck 418. The bonding wave velocity is dependent on a number of parameters and in some embodiments can be described by the expression $$U = \frac{(2\gamma)^{5/4}}{\eta t^{3/4}} \frac{\Lambda^{\frac{1}{2}}}{\left(\frac{E}{1-v^2}\right)^{\frac{1}{4}}} \left(1/9A^{\frac{3}{4}}\right)$$

where U is the bonding wave velocity of the bonding wave, 2γ is the bonding energy, η is the viscosity of air or gas in the chamber 405, t is the wafer thickness, Λ is the mean free path for the gas, A is 0.95, and E is the local Young's modulus of the wafers 100 and 200 and v is the local Poisson's ratio of the wafers 100 and 200. In some embodiments, the wafers 100 and 200 are (001) silicon substrates having respective axes with a silicon crystal orientation of <100> and a silicon crystal orientation of <110>. The axes with silicon crystal orientation of <100> may have a Young's modulus of about 1.3, a Poisson's ratio of about 0.29, and $$\left(\frac{E}{1-v^2}\right)^{\frac{1}{4}}$$

of about 1.4, and the axes with silicon crystal orientation of <110> being prevalent may have a Young's modulus of about 1.7, a Poisson's ratio of about 0.06, and $$\left(\frac{E}{1-v^2}\right)^{\frac{1}{4}}$$

of about 1.7, which may lead to the bonding wave velocity along the axes with a silicon crystal orientation of <100> being faster than the bonding wave velocity along the axes with a silicon crystal orientation of <110>. This may cause the first bonding wave 500 to have an irregular shape, such as a diamond shape, which can cause disadvantageous strain and/or stress variations on the bonded wafers.

The plurality of distance sensors 416 monitor the gap between the wafers 100 and 200 in real time and provide spatial and temporal mapping of the first bonding wave 500 to the controller 380. Each distance sensor 416 measures the distance D1 between the wafers 100 and 200 directly above each distance sensor 416 (see above, FIG. 4D). By measuring the changes in each distance D1 over each distance sensor 416, the propagation of the first bonding wave 500 can be measured in real time by the controller 380.

The real time spatial and temporal mapping of the first bonding wave 500 is further used to modulate the propagation of the first bonding wave 500. The measured data from the distance sensors 416 is used by the controller 380 to establish a correlation between the bonding wave velocity and the vacuum pressure of the vacuum zones 442 on the top wafer chuck 410. Feedback from the mapping of the propagation of the first bonding wave 500 is then used by the controller 380 to modulate the bonding wave velocity in different radial and angular directions. For example, as shown in FIG. 6B, the first bonding wave 500 may have higher bonding wave velocity at angular directions of θ of 0°, 90°, 180°, and 270°, leading to a diamond profile of the first bonding wave 500. The controller 380 may adjust the vacuum pressures of the vacuum zones 442 on the top wafer chuck 410 to decrease the local bonding wave velocity at θ of 0°, 90°, 180°, and 270° and increase the local bonding wave velocity at θ of 45°, 135°, 225°, and 305°, leading to a more uniform profile of the bonding wave velocity. For example, vacuum pressures of the vacuum zones 442 at θ of 0°, 90°, 180°, and 270° may be decreased (increasing the force between the top wafer chuck 410 and the wafer 200 at θ of 0°, 90°, 180°, and 270° and thus decreasing the local bonding wave velocity) and vacuum pressures of the vacuum zones 442 at θ of 45°, 135°, 225°, and 305° may be increased (decreasing the force between the top wafer chuck 410 and the wafer 200 at θ of 45°, 135°, 225°, and 305° and thus increasing the local bonding wave velocity). This may reduce distortion of the bonded wafer pairs from stress and strain variation. The above example is presented for illustrative purposes and is not intended to be limiting. Any angular and radial configurations of increased and decreased vacuum pressures of the vacuum zones 442 are within the scope of the embodiments.

Figure 7A:
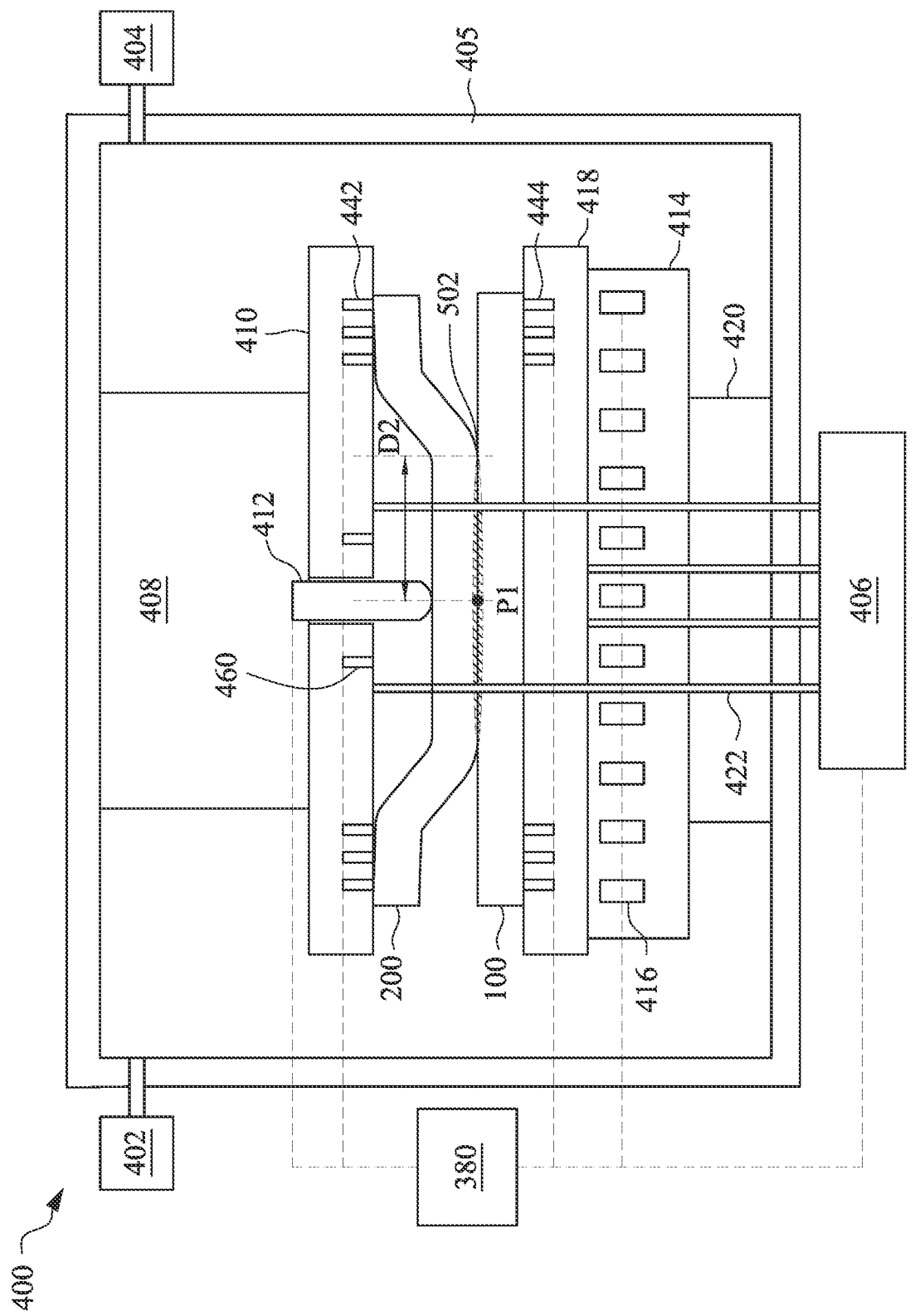
FIG. 7A illustrates a cross-sectional view of an intermediate step in a bonding process, in accordance with some embodiments.
Figure 7B:
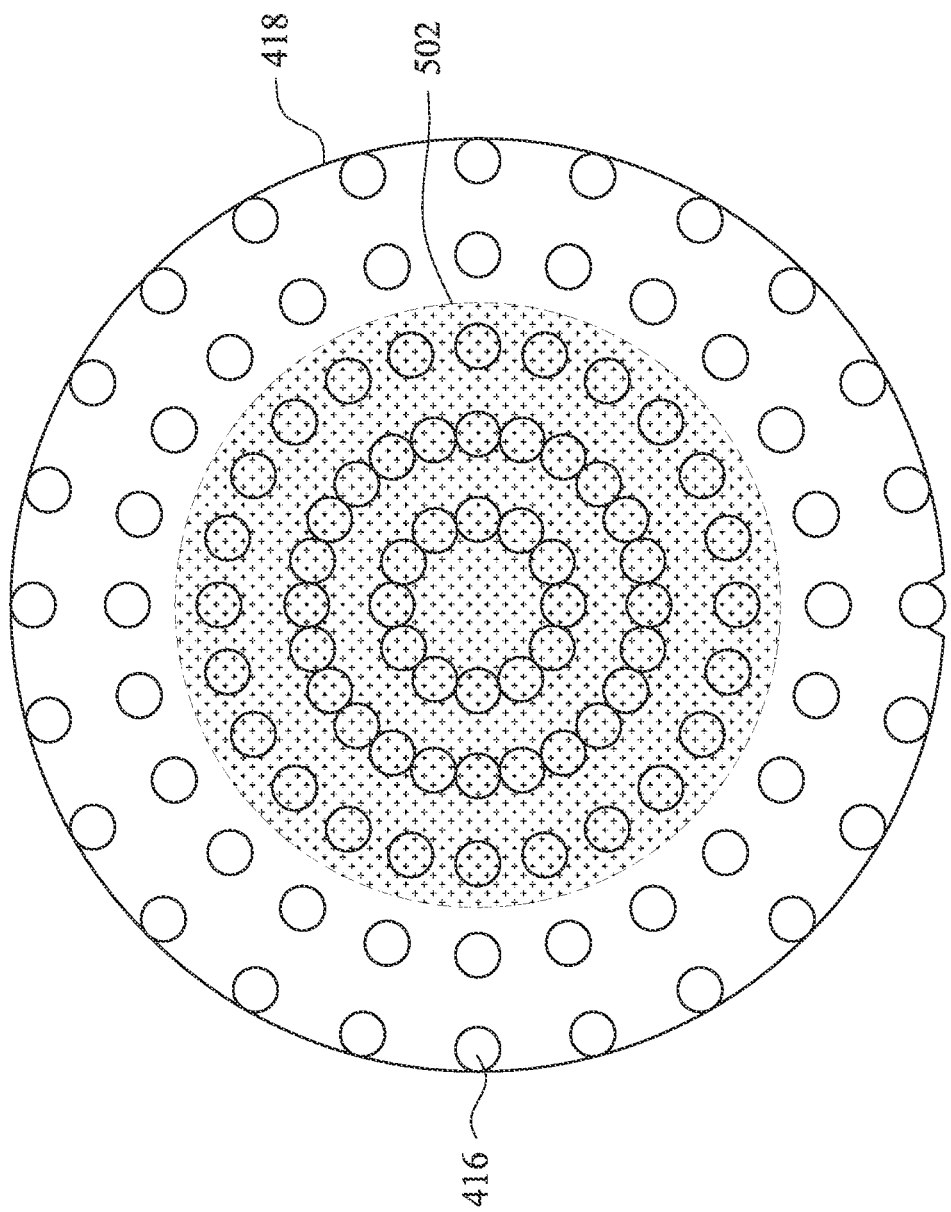
FIG. 7B illustrates a top view of a wafer chuck during an intermediate step in a bonding process, in accordance with some embodiments.

FIGS. 7A and 7B illustrate a modulated bonding wave 502 between the wafers 100 and 200 reaching a distance D2 from the point P1, in accordance with some embodiments. The modulated bonding wave 502 has a circular profile due to the modulation of the propagation of the first bonding wave 500 (see above, FIGS. 6A and 6B) by adjusting the vacuum pressures of the vacuum zones 442 on the top wafer chuck 410. The more uniform circular profile of the modulated bonding wave 502 may decrease distortion of the bonded wafers 100 and 200 from stress and strain variation. Once the modulated bonding wave 502 reaches a distance D2 in a range of 50 mm to 120 mm depending on film properties and patterning scheme, the vacuum zones 442 on the top wafer chuck 410 are deactivated. This releases the wafer 200 from the top wafer chuck 410 and allows the modulated bonding wave 502 to propagate to the edges of the wafers 100 and 200.

Figure 8A:
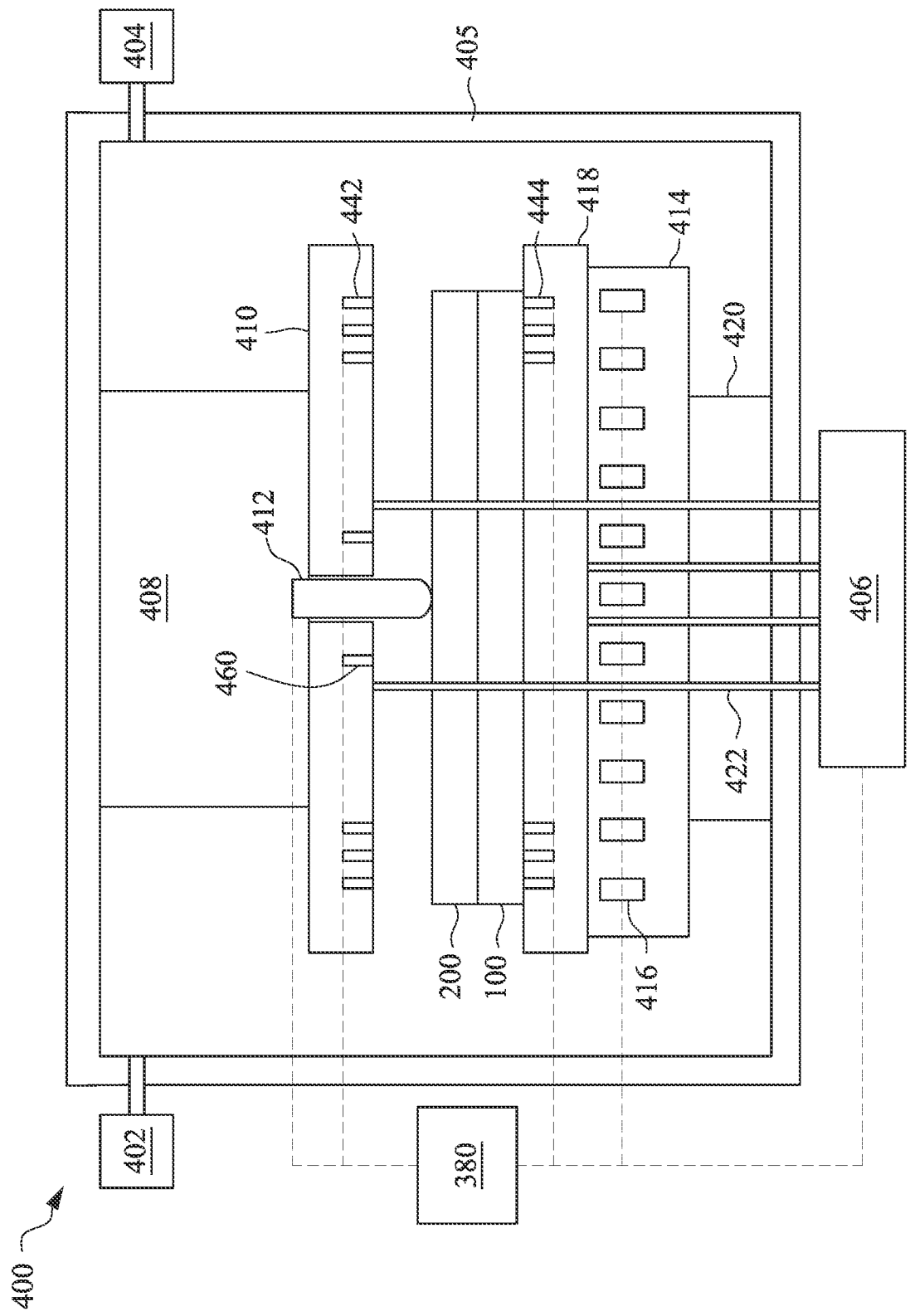
FIG. 8A illustrates a cross-sectional view of an intermediate step in a bonding process, in accordance with some embodiments.
Figure 8B:
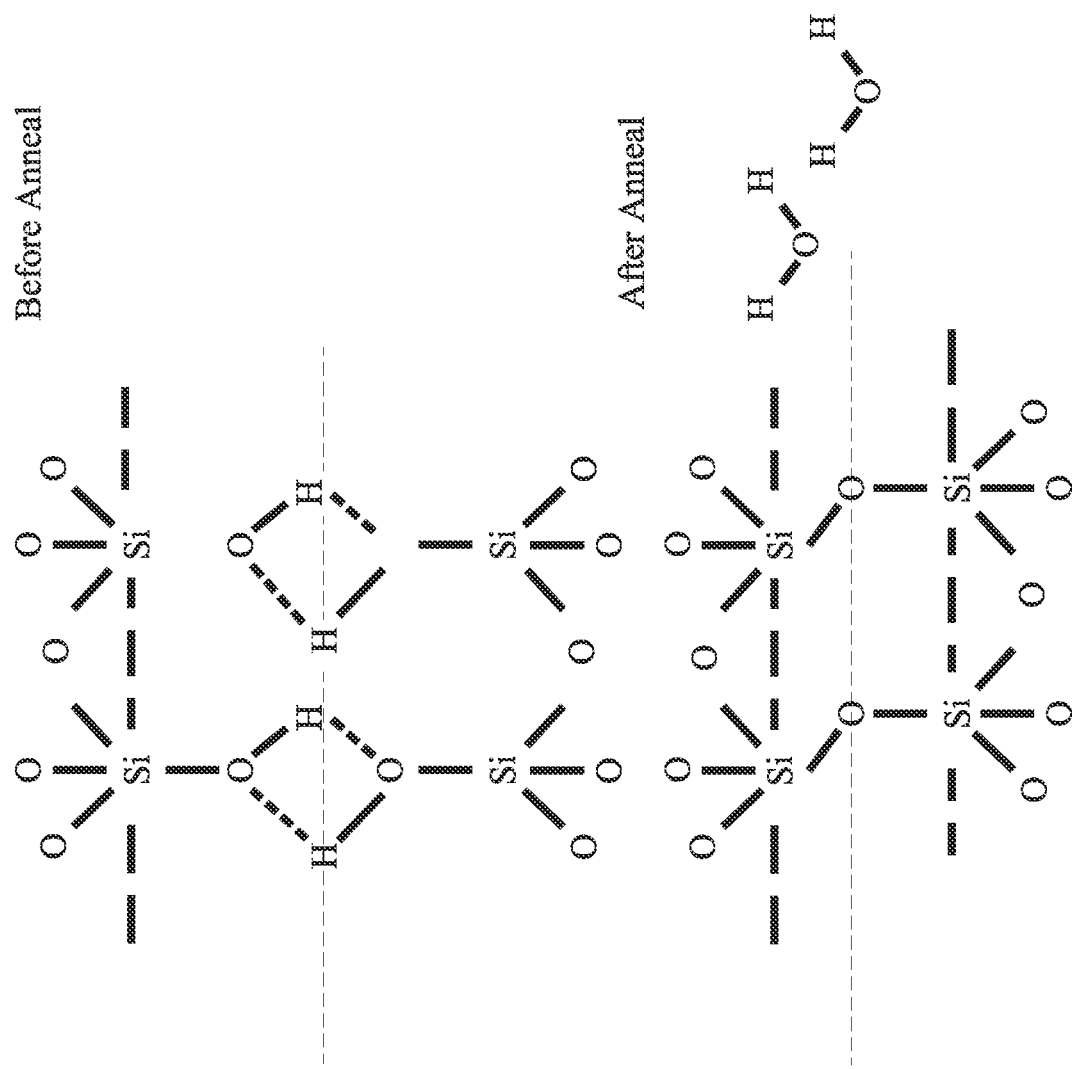
FIG. 8B illustrates a chemical reaction of an intermediate step in a bonding process, in accordance with some embodiments.

FIG. 8A illustrates the wafers 100 and 200 after the modulated bonding wave 502 has propagated to the edges of the wafers 100 and 200. Subsequently, in some embodiments an anneal is performed to form permanent adhesion (e.g., fusion bond) the wafers 100 and 200 together by forming chemical bonds between the oxide surfaces. For example, FIG. 8B illustrates hydrogen and oxygen atoms of the hydrogen bonds between the wafers 100 and 200 breaking off to form water molecules as the atoms (such as oxygen atoms) on the interface of the wafers 100 and 200 form chemical or covalence bonds (such as Si—O—Si bonds) with the atoms (such as silicon atoms) in the wafers 100 and 200. Slight variations in surfaces of the bonding structures can be overcome through the annealing process while pressure keeps the structures together. In some embodiments a bond strength of about 0.5 to 10 J/m$^2$ can be exerted to hold the wafers 100 and 200 together. Other embodiments may not utilize a pressing force.

After the bonding process is completed, the one or more push pins 412 is retracted and the bonded wafers 100 and 200 are removed from the bottom wafer chuck 418, such as by a transfer robot 306. The bonded wafers 100 and 200 may then be transferred back to the loading stations 302 or 304 by the transfer robot 306, where the bonded wafers 100 and 200 are unloaded from the wafer bonding system 300.

Figure 9:
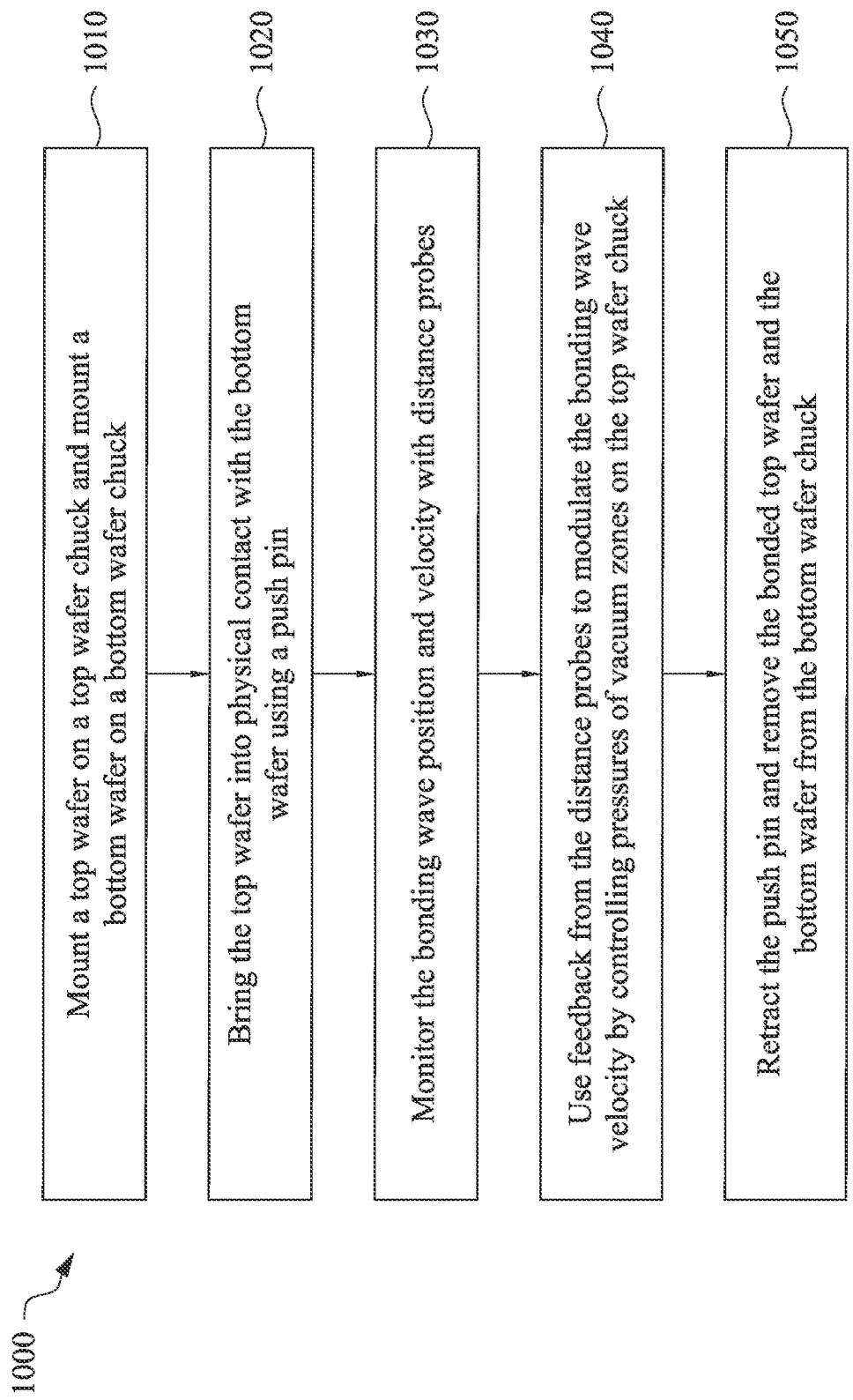
FIG. 9 illustrates a flow chart of a method of a bonding process, in accordance with some embodiments.

FIG. 9 illustrates a method 1000 of bonding two wafers 100 and 200 as illustrated in FIGS. 1 through 8B. In step 1010, a wafer 200 is mounted on a top wafer chuck 410 and a wafer 100 is mounted on a bottom wafer chuck 418, as described above with respect to FIG. 4A. In step 1020, the wafer 200 is brought into physical contact with the wafer 100 by using a push pin 412, as described above with respect to FIG. 5A. In step 1030, the position and velocity of the first bonding wave 500 is monitored with distance sensors 416, as described above with respect to FIGS. 6A and 6B. In step 1040, feedback from the distance sensors 416 is used to modulate the bonding wave velocity by controlling pressures of vacuum zones 442 on the top wafer chuck 410, as described above with respect to FIGS. 6A through 7B. In step 1050, the push pin 412 is retracted and the bonded wafers 100 and 200 are removed from the bottom wafer chuck 418, as described above in respect to FIGS. 8A and 8B.

Embodiments may achieve advantages. A wafer bonding system bonds a first wafer to a second wafer with a more uniform bonding wave velocity. Distance sensors monitor the distances between the first wafer and the second wafer at different radial and angular positions in real time. The bonding wave velocity is modulated by using feedback of measurements from the distance sensors to control the vacuum pressure of vacuum zones on a wafer chuck holding the second wafer. Unfavorable patterning shape changes and distortion of the bonded wafer pairs from stress and strain variation may be reduced by controlling the bonding wave propagation to be more uniform in radial and angular directions.

In accordance with an embodiment, a wafer bonding system includes: a chamber; a first wafer chuck in the chamber, the first wafer chuck having a first surface to support a first wafer, a plurality of distance sensors being mounted on the first wafer chuck, the plurality of distance sensors being connected to a controller; and a second wafer chuck having a second surface to support a second wafer, the second surface being opposite the first surface, the second wafer chuck and the first wafer chuck being movable relative to each other, the second surface including a plurality of vacuum zones, wherein respective vacuum pressures of each vacuum zone of the plurality of vacuum zones is set by the controller using input from the plurality of distance sensors. In some embodiments of the wafer bonding system, the plurality of distance sensors includes a plurality of infrared interferometers. In some embodiments of the wafer bonding system, each infrared interferometer of the plurality of infrared interferometers is configured to measure a local distance between the first wafer and the second wafer. In some embodiments of the wafer bonding system, the second wafer chuck further includes a light source with an output wavelength larger than 1.1 µm. In some embodiments of the wafer bonding system, the plurality of distance sensors is mounted on a third surface of the first wafer chuck, the third surface being opposite the first surface. In some embodiments of the wafer bonding system, the first wafer chuck is transparent to infrared light. In some embodiments of the wafer bonding system, the plurality of distance sensors are uniformly distributed in an angular direction with respect to a top surface of the first wafer chuck.

In accordance with another embodiment, a method includes: mounting a first wafer on a first wafer chuck and mounting a second wafer on a second wafer chuck; bringing the second wafer into physical contact with the first wafer; monitoring a relative distance between the first wafer and the second wafer using a distance sensor; controlling a pressure of a vacuum zone on the second wafer chuck using feedback from the distance sensor; and removing the bonded first wafer and second wafer from the first wafer chuck. In some embodiments of the method, the distance sensor is an infrared interferometer. In some embodiments of the method, the distance sensor is mounted beneath the first wafer chuck. In some embodiments of the method, the pressure of the vacuum zone is decreased in response to feedback from the distance sensor, the decrease decelerating a local velocity of a bonding wave between the first wafer and the second wafer. In some embodiments of the method, the pressure of the vacuum zone is increased in response to feedback from the distance sensor, the increase accelerating a local velocity of a bonding wave between the first wafer and the second wafer. In some embodiments of the method, bringing the second wafer into physical contact with the first wafer includes using a push pin extending through the second wafer chuck.

In accordance with yet another embodiment, a method includes: loading a first wafer and a second wafer into a wafer bonding system; using a push pin to physically contact the second wafer with the first wafer at a first point; modulating a velocity of a first bonding wave between the first wafer and the second wafer using feedback from a plurality of distance sensors, the modulating the velocity of the first bonding wave including controlling a pressure of a first vacuum zone coupled to the second wafer; and after the first wafer and the second wafer are bonded, removing the first wafer and the second wafer from the wafer bonding system. In some embodiments of the method, the modulating the velocity of the first bonding wave further includes controlling respective pressures of a plurality of vacuum zones, the plurality of vacuum zones being on a bottom surface of a first wafer chuck, the first wafer chuck holding the second wafer during a propagation of the first bonding wave. In some embodiments of the method, the plurality of distance sensors are mounted below a second wafer chuck, the second wafer chuck holding the first wafer during the propagation of the first bonding wave. In some embodiments of the method, the second wafer chuck is at least partially transparent to infrared light. In some embodiments of the method, before the modulating the velocity of the first bonding wave, the first bonding wave includes a diamond profile. In some embodiments of the method, after the modulating the velocity of the first bonding wave, the first bonding wave includes a circular profile. In some embodiments, the method further includes: after the first bonding wave reaches edges of the first wafer and the second wafer, retracting the push pin; and annealing the bonded first wafer and the second wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  mounting a first wafer on a first wafer chuck and mounting a second wafer on a second wafer chuck;
  bringing the second wafer into physical contact with the first wafer;
  monitoring a first relative distance between the first wafer and the second wafer using a first distance sensor in a first area above the first distance sensor, and monitoring a second relative distance between the first wafer and the second wafer using a second distance sensor in a second area above the second distance sensor, wherein the first relative distance is smaller than the second relative distance, wherein each distance sensor measures intensity peaks at a plurality of interfaces to determine the respective relative distances, and wherein changes in the measured relative distances over time indicate propagation of a bonding wave between the first and second wafers;
  independently controlling levels of applied vacuum of a first vacuum zone and a second vacuum zone on the second wafer chuck using feedback from the first distance sensor and the second distance sensor, wherein the first vacuum zone is above the first area and the second vacuum zone is above the second area, and wherein responsive to the changes in the measured relative distances indicating non-uniform bonding wave propagation, the level of applied vacuum of the first vacuum zone is increased and the level of applied vacuum of the second vacuum zone is decreased to compensate for detected variations in bonding wave velocity; and
  removing the bonded first wafer and second wafer from the first wafer chuck.

2. The method of claim 1, wherein the first distance sensor and the second distance sensor are infrared interferometers.

3. The method of claim 1, wherein the first distance sensor and the second distance sensor are mounted beneath the first wafer chuck.

4. The method of claim 1, wherein the decreased level of applied vacuum of the second vacuum zone accelerates a local velocity of a bonding wave between the first wafer and the second wafer in the second area.

5. The method of claim 1, wherein the increased level of applied vacuum of the first vacuum zone decelerates a local velocity of a bonding wave between the first wafer and the second wafer in the first area.

6. The method of claim 1, wherein bringing the second wafer into physical contact with the first wafer comprises using a push pin extending through the second wafer chuck.

7. A method comprising:
  loading a first wafer and a second wafer into a wafer bonding system, wherein the first wafer is on a top surface of a first wafer chuck and the second wafer is on a bottom surface of a second wafer chuck, wherein the second wafer chuck comprises a first vacuum zone and a second vacuum zone, wherein the first vacuum zone and the second vacuum zone are arranged in a segmented ring pattern;
  using a push pin to physically contact the second wafer with the first wafer at a first point;
  modulating a velocity of a first bonding wave between the first wafer and the second wafer using feedback from a plurality of distance sensors, wherein each distance sensor measures intensity peaks at a plurality of interfaces to determine distances between the first and second wafers, the modulating the velocity of the first bonding wave comprising independently controlling pressure levels of the first vacuum zone and the second vacuum zone based on measured changes in the determined distances over time indicating propagation of the first bonding wave, wherein responsive to the measured changes in the determined distances indicating non-uniform bonding wave propagation, the pressure level of the first vacuum zone is increased and the pressure level of the second vacuum zone is decreased to compensate for detected variations in bonding wave velocity; and
  after the first wafer and the second wafer are bonded, removing the first wafer and the second wafer from the wafer bonding system.

8. The method of claim 7, wherein the plurality of distance sensors are mounted below the first wafer chuck.

9. The method of claim 8, wherein the first wafer chuck is at least partially transparent to infrared light.

10. The method of claim 7, wherein before the modulating the velocity of the first bonding wave, the first bonding wave comprises a diamond profile.

11. The method of claim 7, wherein after the modulating the velocity of the first bonding wave, the first bonding wave comprises a circular profile.

12. The method of claim 7, further comprising:
after the first bonding wave reaches edges of the first wafer and the second wafer, retracting the push pin; and
annealing the bonded first wafer and the second wafer.

13. The method of claim 7, wherein the push pin extends through the second wafer chuck, and wherein an infrared light source is disposed adjacent the push pin in the second wafer chuck.

14. A method comprising:
placing a first wafer on a first wafer chuck and placing a second wafer on a second wafer chuck;
bringing a first portion of the second wafer into physical contact with the first wafer;
monitoring distances between the first wafer and the second wafer at a plurality of locations using a plurality of infrared distance sensors on the first wafer chuck, wherein each infrared distance sensor measures intensity peaks at a plurality of interfaces to determine distances between the first and second wafers;
independently adjusting pressure levels of a plurality of vacuum zones on the second wafer chuck using feedback from the plurality of infrared distance sensors, wherein the plurality of vacuum zones comprise a first vacuum zone and a second vacuum zone, wherein the first vacuum zone and the second vacuum zone are spaced apart from a center of the second wafer chuck by a same distance, wherein responsive to measured changes in the determined distances indicating non-uniform bonding wave propagation, a pressure level of the first vacuum zone is increased and a pressure level of the second vacuum zone is decreased to compensate for detected variations in bonding wave velocity; and
removing the bonded first wafer and second wafer from the first wafer chuck.

15. The method of claim 14, wherein the first wafer is separated from the plurality of infrared distance sensors by the first wafer chuck, and wherein the first wafer chuck is at least partially transparent to infrared light.

16. The method of claim 14, wherein the second wafer chuck further comprises an infrared light source with an output wavelength larger than 1.1 µm.

17. The method of claim 14, wherein the plurality of infrared distance sensors are low-coherence interferometry infrared sensors.

18. The method of claim 14, wherein the plurality of distance sensors are uniformly distributed in angular directions with respect to a top surface of the first wafer chuck.

19. The method of claim 18, wherein the plurality of distance sensors are uniformly distributed in radial directions with respect to the top surface of the first wafer chuck.

20. The method of claim 14, wherein bringing the first portion of the second wafer into physical contact with the first wafer comprises using a push pin extending through the second wafer chuck.

* * * * *